(12) United States Patent
Arcos et al.

(10) Patent No.: US 9,438,015 B2
(45) Date of Patent: Sep. 6, 2016

(54) TRIANGLE FLAP ARC VENT

(75) Inventors: Waldo Arcos, Nuevo Leon (MX); Luis Islas, San Pedro Garza G (MX)

(73) Assignee: Schneider Electric USA, Inc., Schaumburg, IL (US)

( * ) Notice: Subject to any disclaimer, the term of this patent is extended or adjusted under 35 U.S.C. 154(b) by 956 days.

(21) Appl. No.: 13/308,710

(22) Filed: Dec. 1, 2011

(65) Prior Publication Data

US 2013/0143478 A1 Jun. 6, 2013

(51) Int. Cl.
*H05K 5/00* (2006.01)
*H02B 13/025* (2006.01)
*H01H 33/08* (2006.01)

(52) U.S. Cl.
CPC ............ *H02B 13/025* (2013.01); *H01H 33/08* (2013.01); *H05K 5/00* (2013.01)

(58) Field of Classification Search
CPC ................................ H05K 5/00; H01H 33/08
USPC .......................................................... 454/184
See application file for complete search history.

(56) References Cited

U.S. PATENT DOCUMENTS

| | | | |
|---|---|---|---|
| 5,710,402 A | 1/1998 | Karnbach et al. | |
| 5,890,656 A * | 4/1999 | Fuhlbrigge | 239/227 |
| 6,407,331 B1 | 6/2002 | Smith et al. | |
| 6,695,202 B2 * | 2/2004 | Miess | 229/115 |
| 6,726,242 B2 | 4/2004 | Moon | |
| 8,101,881 B2 * | 1/2012 | Miller et al. | 218/157 |
| 8,142,140 B2 * | 3/2012 | Warizaya | 415/146 |
| 2003/0117045 A1 | 6/2003 | Byron et al. | |

FOREIGN PATENT DOCUMENTS

DE 2951829 A1 7/1981

OTHER PUBLICATIONS

International Search Report corresponding to co-pending International Patent Application Serial No. PCT/US2012/065585, European Patent Office, dated Feb. 7, 2012; (4 pages).
International Written Opinion corresponding to co-pending International Patent Application Serial No. PCT/US2012/065585, European Patent Office, dated Feb. 7, 2013; (7 pages).

* cited by examiner

*Primary Examiner* — Helena Kosanovic
(74) *Attorney, Agent, or Firm* — Locke Lord LLP

(57) ABSTRACT

An arc blast vent for an electrical equipment enclosure has a plate forming a part of the enclosure with triangular cutouts arranged within a regular polygonal area of the plate and having a frame of the plate material in between them. Substantially identical triangle shaped flaps, each having hold downs along and adjacent to a first leg of the triangle for attachment to the plate, and in from the first leg have a line of perforations through the triangle forming a weakened area for a deformable hinge. Each of the triangle shaped metal flaps have the second and third legs with their edges resting without tenacious engagement on the frame of the plate material.

11 Claims, 4 Drawing Sheets

TRIANGLE FLAP ARC VENT

BACKGROUND OF THE INVENTION

1. Field of the Invention

The present invention relates generally to electrical enclosures. The present invention relates particularly to protection of the enclosure and components therein from arc blast damage with a strong, fast arc blast vent.

2. Discussion of Related Art

Metal clad switch gear cabinets are parts of the electrical distribution equipment chain designed to provide a compartmentalized cabinet for protection of the distribution equipment such as circuit breakers, bus bars, transformers, and related control equipment and the environment and people surrounding the equipment.

Short circuits or other uncontrolled electrical conduction within the cabinet can create an arc which results in a plasma and rapidly expanding arc gases, a so-called arc blast, which may burn through the cabinet or destroy its utility/safety by expansion of the metal skin and or frame of the cabinet.

As arcs occur it is important to quickly vent these gases to the outside of the cabinet. Within the known art there are several types of mechanisms for the venting of arc gases to the outside of the cabinet.

Any electrical cabinet subject to arcing and arc blast pressures such as switch gear, switch board, motor control centers, etc. to be considered "arc resistant" may need venting for the superheated arc gases and associated particulates.

ANSI Type 1 and Type 2 arc resistant switch gear both vent arc gases and associated particulates out the top of the cabinet. See ANSI/IEEE C37.20.7-2007; EEMAC G14-1987 and IEC 62271-200. Given these requirements, any venting "flue" should also be covered with a strong flap to prevent contamination of the interior of the cabinet or accidental deformation inward from objects or people contacting the vent cover, while providing a quick acting vent opening to the outside of the cabinet. Therefore, the arc blast vents must be strong to bear an inwardly directed load of, e.g., being stepped on by installers or maintenance workers.

In one type of vent cover known in the art, plates of metal, often called flaps, have one or more edges fastened or integral with the top structure of the cabinet. The free edges of the flaps allow the flaps to be bent upwardly under the arc gas pressure to create the vent opening.

In the known art there are arc blast vent such as shown in U.S. Pat. No. 6,407,331 to Smith et al., which creates the flaps from a solid top sheet which is cut to form the free edges of the flaps. The top sheet area creating the flaps is then reinforced underneath with additional structure. There are also arc blast vents for equipment like SQUARE D brand Motor Control Center and Power Zone 4 cabinets having a cut out vent area which leaves integral top plate structure which is then overlaid with rectangular flaps fastened to the top plate.

SUMMARY

The triangular flap arc blast vent of the present invention in its various aspects provides desirable arc venting structures which are economical to manufacture and install and may be easily replaceable. Such arc vents further provide effective vent opening volume which is created quickly to vent the gases.

A new arc vent design is disclosed here that provides a quicker opening and greater load bearing flap area. The arc vent is economical because it uses substantially identical triangular flaps and is also strong because it uses an opening integral to the top plate which provides load bearing support to the triangular flaps. The flaps push outward to open the envelope of the contained area of the cabinet and do so with increased speed because the triangular flaps have a low mass moment of inertia without sacrificing pressure area reactive to the arc blast gases.

In some aspects the flaps are right isosceles triangles which provide a maximal amount of vent opening per square surface vent area. As an arc blast takes place, the flaps of the vent are forced outwards from the enclosure within milliseconds. In one aspect of the invention an arc blast vent for an electrical equipment enclosure, whether on an exterior or interior compartment of the enclosure, may have a plate forming a part of the enclosure with a plurality of substantially equally shaped cutouts in a regular polygonal area such as four triangular cutouts arranged within a substantially square area of the plate and having a frame of the plate material in between them. In a preferred aspect, four substantially identical isosceles triangle shaped flaps each have screw hold downs along and adjacent to a first leg of the triangle for attachment to the plate, and in from the first leg have a hinge which may be a line of perforations through the triangle forming a weakened area for a deformable hinge intended for a single opening event. Each of the triangle shaped metal flaps have the second and third legs with their edges resting without tenacious engagement on the frame of the plate material.

In one aspect of the invention an arc blast vent for an electrical equipment cabinet, has a metal plate with four triangular cutouts arranged within a substantially square area of the plate and has a frame of the plate metal in between them; four isosceles triangle shaped metal flaps, each of said flaps having screw hold downs along and adjacent to a first leg of the triangle for attachment to the top plate, and in from the first leg a line of perforations through the triangle forming a weakened area for a deformable hinge; and each of the triangle shaped metal flaps having second and third legs with edges resting without tenacious engagement on the frame.

In some aspects of the invention the four triangular cutouts are four right triangular cutouts. In some aspects of the invention the right triangular cutouts are isosceles triangles. In some aspects of the invention the right triangular cutouts have a cruciform frame of the top plate metal in between them. In some aspects of the invention the triangular flaps have second and third leg edges resting on the cruciform frame of the top plate metal. In some aspects of the invention the four isosceles triangle shaped metal flaps are right triangular flaps. In some aspects of the invention the four isosceles triangle shaped metal flaps are substantially identically shaped and dimensioned.

In one aspect of the invention an electrical equipment cabinet has an arc blast vent for a contained area therein, with a metal plate forming a part of the enclosure, the metal plate having four triangular cutouts arranged within a substantially square area of the plate and has a frame of the plate metal in between them. The vent further includes four isosceles triangle shaped metal flaps, each of said flaps having screw hold downs along and adjacent to a first leg of the triangle for attachment to the plate, and in from the first leg a line of perforations through the triangle forming a weakened area or line for creating a deformable hinge. Each of the triangle shaped metal flaps then has second and third legs with edges resting without tenacious engagement on the frame.

While the present invention will be described in detail with respect to switch gear cabinets, any electrical enclosure needing a passive vent mechanism for arc blast venting may benefit from the present invention.

BRIEF DESCRIPTION OF THE DRAWINGS

The foregoing and other advantages of the present disclosure will become apparent upon reading the following detailed description and upon reference to the drawings of which.

DETAILED DESCRIPTION OF A PREFERRED EMBODIMENT

Words of degree, such as "about", "substantially", and the like are used herein in the sense of "at, or nearly at, when given the manufacturing, design, and material tolerances inherent in the stated circumstances" and are used to prevent the unscrupulous infringer from unfairly taking advantage of the invention disclosure where exact or absolute figures and operational or structural relationships are stated as an aid to understanding the invention.

Figure 1:
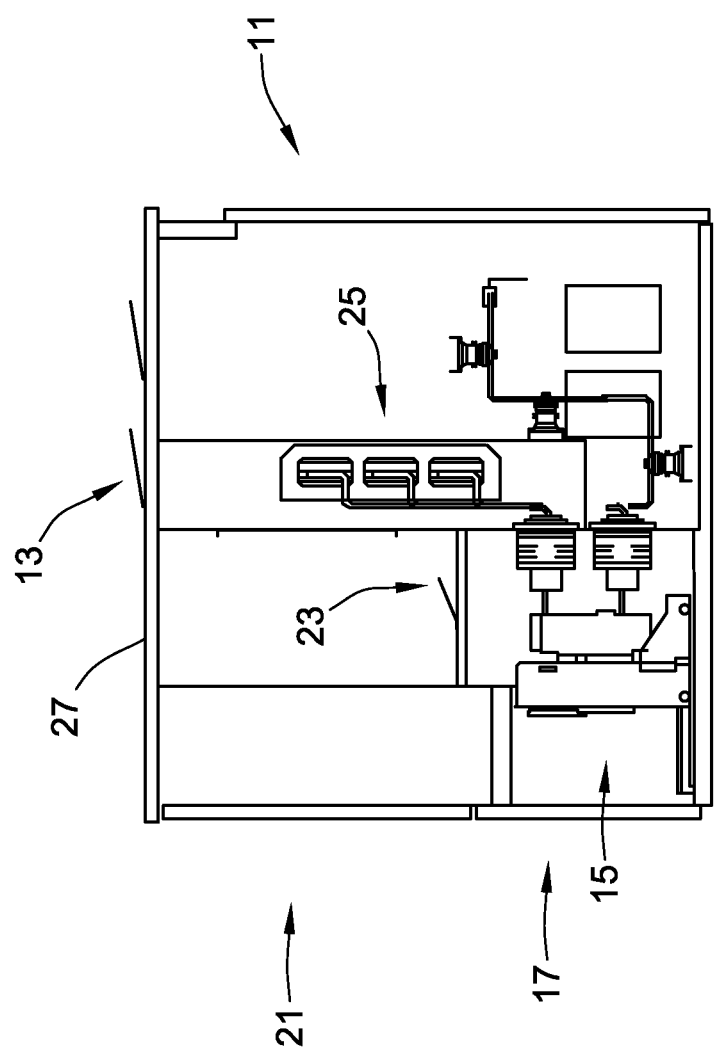
FIG. 1 is a side view of a switch gear cabinet electrical enclosure with an arc vent.

As seen in FIG. 1, a side view of an electrical enclosure, such as switch gear cabinet 11, with an arc blast vent 13, hereinafter "arc vent," is shown with a side of its cabinet 11 removed to show the internal parts. By way of illustration and explanation of the environment of the present invention, circuit breakers 15 are in the lower compartments 17 of the cabinet 11 with control equipment (not shown) in the upper compartments 21. The compartments are generally enclosed and segregated to protect the individual types of equipment. Other arc vents 23 may lead from the compartments to interior arc venting structures or other compartments such as those containing only bus bars 25 before being vented out the top 27 of cabinet 11.

Figure 2:
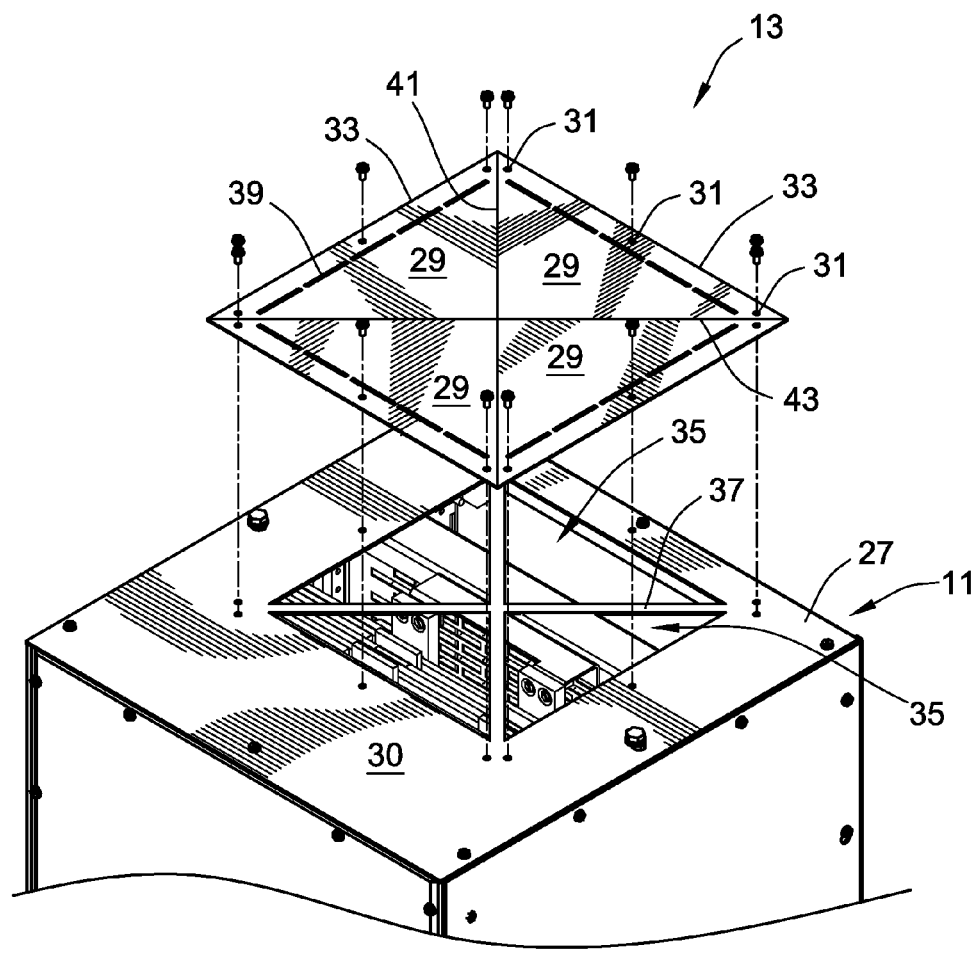
FIG. 2 is a top detail perspective view of an electrical enclosure similar to that of FIG. 1, with the arc vent cover separated therefrom.
Figure 3:
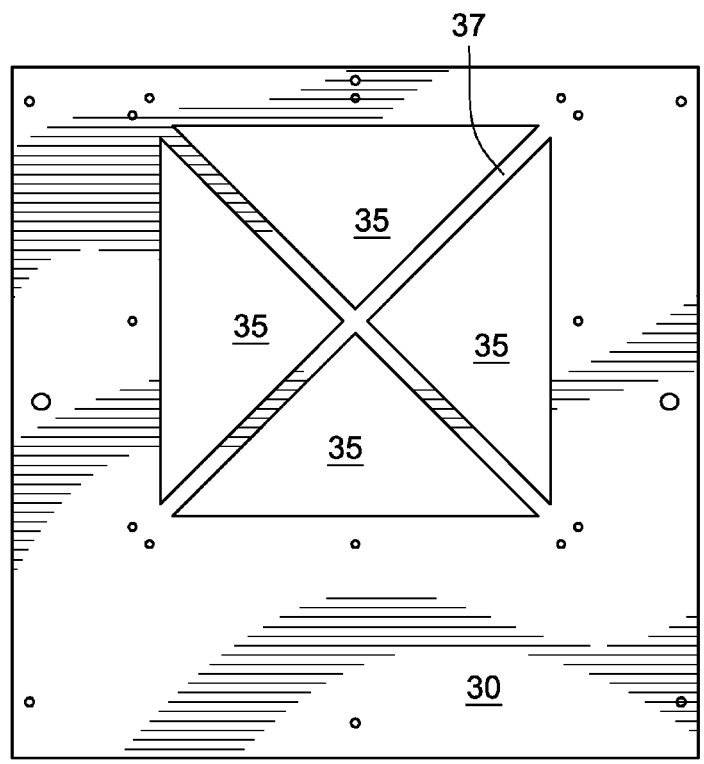
FIG. 3 is a detail top view of the arc vent 13 and top plate 30.

Referring to FIGS. 2 and 3, top views of a cabinet 11 similar to FIG. 1, are shown featuring the arc vent 13, four isosceles triangle shaped metal flaps, collectively 29, (FIG. 3) form the top of the arc vent 13. Each flap has screw hold downs 31 along and adjacent to a first leg 33 of the triangle for attachment to the top plate 30.

It will be noted that in this aspect of the invention all flaps 29 are substantially equal so as to present a minimum number of forming operations and parts for the arc vent 13 thus providing an economic efficiency for forming construction and replacement of the vents. Henceforth, a description of one flap will be understood to describe each of the substantially identical flaps.

The top plate 30 is a metal plate with four triangular cutouts 35 arranged within a substantially square area of the top plate 30 and having a frame 37 of the plate metal in between them. Although described herein as a top plate, it will be appreciated that the plate and vent arrangement may be placed on various walls of an electrical enclosure compartment to implement an arc vent in a selected compartment of the enclosure.

In from the first leg 33 of the triangle of the flap 29 is a line of perforations 39 through the triangle which forms a weakened area for a deformable hinge allowing the flap 29 to bend outward under arc blast pressure to vent the cabinet 11, as further discussed below. Each of the triangle shaped metal flaps 29 has second and third legs 41, 43 with their edges resting without tenacious engagement on the frame 37.

As illustrated in FIG. 2, in some aspects of the invention the four triangular cutouts 35 are four right triangular cutouts. In the illustrated embodiments the right triangular cutouts are isosceles triangles. Also as illustrated, the triangular cutouts form a cruciform frame of perpendicular cross bars of the top plate metal in between them. Each of the triangular flaps 29 will have their second and third leg resting on the cruciform frame of the top plate metal. Additional strips in the reinforced top plate could be added if additional load bearing requirement were determined to be necessary. In those aspects of the invention where the four isosceles triangle shaped metal flaps are right triangular flaps the second and third legs will form the right angle. In the illustrated aspects of the invention the four isosceles triangle shaped metal flaps are substantially identically shaped and dimensioned although certain advantages of the invention may be attained without identical or right triangular flaps. It will be appreciated that the triangular flap provides a low mass moment of inertia without losing much pressure area. Comparisons to a vent of the same area but with two rectangular flaps have shown an increase in opening speed up to the forty five degree)(45°) flap open position of 3.7 msec.

Figure 4:
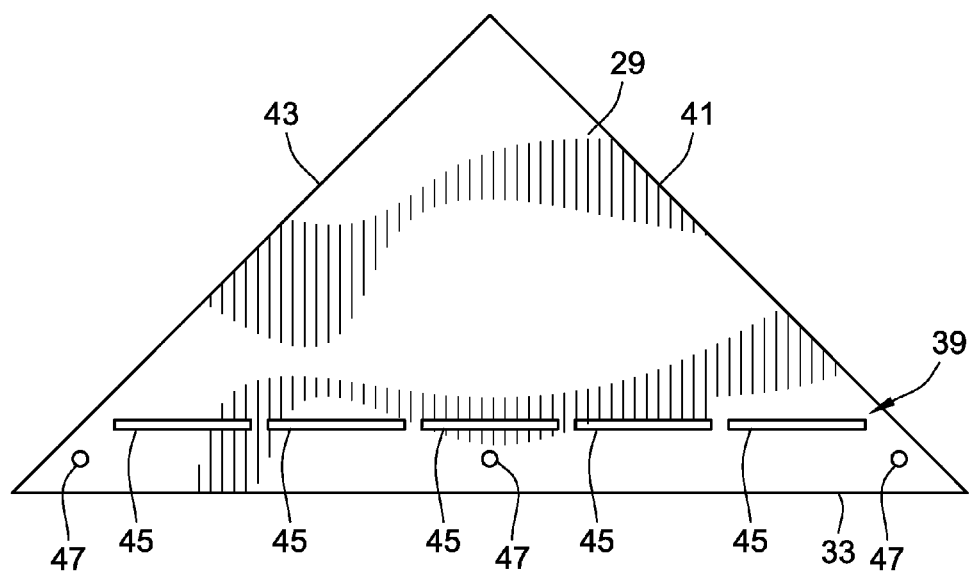
FIG. 4 is a detail of a single flap.

Referring also to FIG. 4, a detail of a flap 29 itself is shown. The line of perforations 39 forms the deformable hinge of the flap and comprises a plurality of perforations 45 which removes a majority of the metal from the flap 29 along the hinge line or area. Dimensionally, for e.g. with a fourteen inch hypotenuse, first leg 33, the triangle flap of FIG. 4 might have the three holes 47 for the screw hold downs in from the first leg 33 about 0.5 inches, with the outer holes placed six inches out towards the second and third legs 41, 43, from the central hole. Five hinge perforations, collectively 45, are spaced one inch in from the first leg 33, are about two inches long and 0.130 inches high. Here, five perforations 45 are shown equidistantly spaced along the first leg 33 with a 2.25 inch center to center spacing. The perforations remove 83.33% of the metal along the hinge line so that only 16.67% of the metal must be bent. The three hold down, e.g., bolt or screw, holes 47 are provided outside the perforate hinge line 39, to allow a fastener to tenaciously attach the flap 29 to the top plate 30. The perforations do not extend to the second leg 41 and third leg 43 of the triangle, i.e. to the other two edges of the flap 29, to prevent tearing of the flap when it bends.

Figure 5:
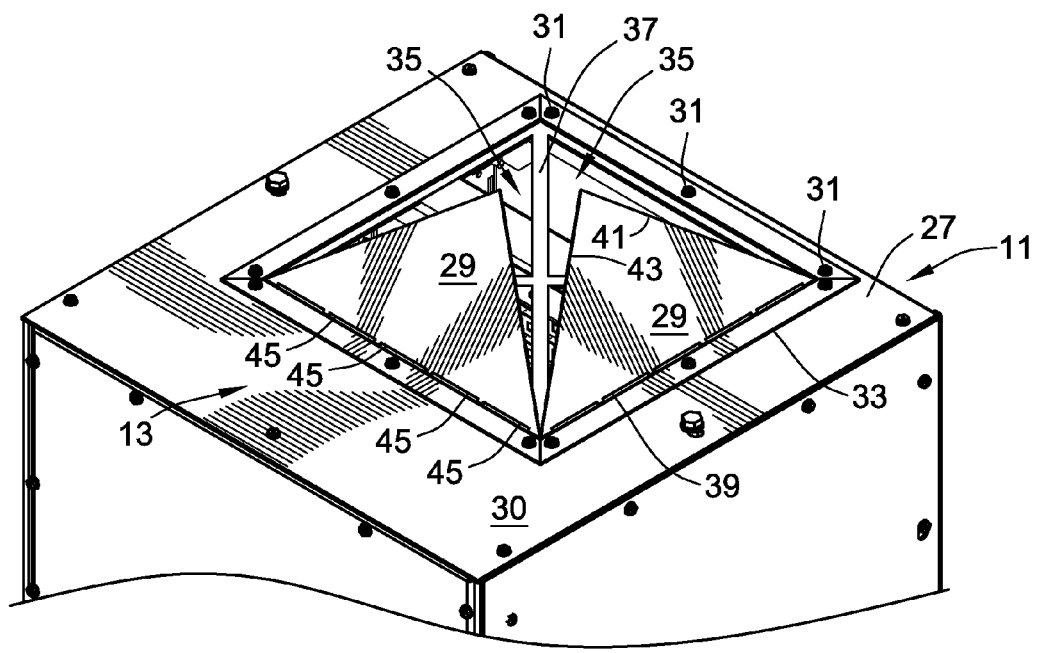
FIG. 5 is a top perspective view of a cabinet with the arc vent flaps partially open and two flaps removed to show detail of the support frame.

Referring to FIG. 5, the flaps 29 (two of which are removed to show detail of the support frame 37) are shown in the forty five degree)(45°) open position. With its combination of low mass moment of inertia flaps, maximal venting area, and speed of opening to an effective venting area, and its efficiencies of construction, the present invention provides several advantages over previous arc vent designs.

Having thus described a system for protecting an interrupter module with floating protection for the blade carrier; it will be appreciated that many variations thereon may occur to the artisan upon an understanding of the present invention, which is therefore to be limited only by the appended claims.

The invention claimed is:

1. An arc vent for an electrical equipment cabinet, comprising:
   a metal plate with four triangular cutouts arranged within a substantially square area of the plate and having a frame of the plate metal in between them;
   four isosceles triangle shaped metal flaps, each of said flaps having screw hold downs along and adjacent to a first leg of the triangle for attachment to the top plate, and in from the first leg a line of perforations through the triangle forming a weakened area for a deformable hinge; and
   each of the triangle shaped metal flaps having second and third legs with edges resting without tenacious engagement on the frame.

2. The arc vent according to claim 1 wherein the four triangular cutouts are four right triangular cutouts.

3. The arc vent according to claim 2 wherein the right triangular cutouts are isosceles triangles.

4. The arc vent according to claim 3 wherein the right triangular cutouts have a cruciform frame of the top plate metal in between them.

5. The arc vent according to claim 4 wherein the second and third leg edges of the flaps rest on the cruciform frame of the top plate metal.

6. The arc vent according to claim 1 wherein the four isosceles triangle shaped metal flaps are right triangular flaps.

7. The arc vent according to claim 1 wherein the four isosceles triangle shaped metal flaps are identically shaped and dimensioned.

8. An electrical equipment cabinet with an arc vent, comprising:
   a top plate, side plates, and bottom plate forming the exterior of the cabinet;
   the top plate having four right triangular cutouts arranged within a substantially square area of the top plate and having a cruciform frame of the top plate material in between them;
   four substantially identical right angle isosceles triangle bendable flaps with a hypotenuse side, having mechanical hold downs on the hypotenuse side, and in from the hypotenuse side a line of perforations forming a deformable hinge;
   each of the right angle leg edges of the flaps resting on the cruciform frame.

9. An electrical equipment cabinet with an arc vent, according to claim 8, wherein the top plate and flaps are metal.

10. An arc blast vent for an electrical equipment cabinet, comprising:
    a metal plate with a plurality of substantially equally shaped cutouts within a regular polygonal area, said cutouts having a frame of the plate metal in between them;
    a triangle shaped metal flap covering each cutout, each of said flaps having a hinge and mechanical hold downs along and adjacent to a first leg of the triangle for attachment to the plate; and
    each of the triangle shaped metal flaps having second and third legs with edges resting without tenacious engagement on the frame.

11. The arc blast vent for an electrical equipment cabinet according to claim 10 wherein each of said flaps is substantially identical.

* * * * *